(12) United States Patent
Fiore et al.

(10) Patent No.: US 10,955,464 B2
(45) Date of Patent: Mar. 23, 2021

(54) HEALTH MONITORING OF A CIRCUIT

(71) Applicant: Infineon Technologies AG, Neubiberg (DE)

(72) Inventors: Vincenzo Fiore, Linz (AT); Oliver Frank, Linz (AT); Helmut Kollmann, Linz (AT); Michael Platzer, Enns (AT); Thomas Sailer, Zwettl a.d. Rodl (AT); Jochen O. Schrattenecker, Reichenthal (AT)

(73) Assignee: Infineon Technologies AG

( * ) Notice: Subject to any disclaimer, the term of this patent is extended or adjusted under 35 U.S.C. 154(b) by 284 days.

(21) Appl. No.: 15/960,911

(22) Filed: Apr. 24, 2018

(65) Prior Publication Data
US 2018/0313893 A1 Nov. 1, 2018

(30) Foreign Application Priority Data

Apr. 28, 2017 (DE) ...................... 10 2017 109 266.8

(51) Int. Cl.
*G01R 31/28* (2006.01)
*G01R 19/10* (2006.01)

(52) U.S. Cl.
CPC ..... *G01R 31/2851* (2013.01); *G01R 31/2834* (2013.01); *G01R 31/2856* (2013.01); *G01R 19/10* (2013.01)

(58) Field of Classification Search
CPC ............ G01R 31/2851; G01R 31/2834; G01R 31/2856; G01R 19/10
See application file for complete search history.

(56) References Cited

U.S. PATENT DOCUMENTS

| | | | | |
|---|---|---|---|---|
| 7,940,034 | B2 * | 5/2011 | Pelz | ........................ H02M 1/32 |
| | | | | 323/284 |
| 2005/0062481 | A1 * | 3/2005 | Vaughn | ................... G01R 31/44 |
| | | | | 324/500 |
| 2009/0000659 | A1 | 1/2009 | Hasegawa et al. | |
| 2010/0282289 | A1 | 11/2010 | Wu et al. | |
| 2012/0235869 | A1 * | 9/2012 | Allen | ...................... B82Y 10/00 |
| | | | | 343/720 |
| 2015/0226788 | A1 * | 8/2015 | Toda | ........................ G01J 5/026 |
| | | | | 324/762.07 |
| 2015/0381273 | A1 * | 12/2015 | Gloeckner | ......... H04B 10/0779 |
| | | | | 398/16 |

OTHER PUBLICATIONS

Application Note PVA-600-1, Guide to Interpreting I-V Curve Measurements of PV Arrays, 2011 (Year: 2011).*

* cited by examiner

*Primary Examiner* — Daniel R Miller
(74) *Attorney, Agent, or Firm* — Design IP (57) ABSTRACT

A method is disclosed use with a circuit device that includes a circuit having a predetermined voltage-current characteristic and a detector configured to detect a voltage-current relation of the circuit. The method includes using the detector to detect the voltage-current relation of the circuit, and indicating if the detected voltage-current relation differs from the predetermined voltage-current characteristic. A circuit device includes a circuit having a predetermined voltage-current characteristic, and a detector configured to detect a voltage-current relation of the circuit. The circuit device is configured to indicate if the detected voltage-current relation differs from the predetermined voltage-current characteristic.

21 Claims, 9 Drawing Sheets

HEALTH MONITORING OF A CIRCUIT

FIELD

This disclosure relates generally to electrical, electronic, and/or semiconductor circuit devices.

BACKGROUND

Electrical, electronic, or semiconductor devices (hereinafter referred to as 'device under test' or 'DUT') suffer from various defects and malfunctionings. The DUT must be comprehensively tested during the manufacturing process to limit any structural faults or process faults. A manufacturing process variation or a manufacturing defect can cause a process fault in the DUT e.g. an open, short, or a shift in the operating point of a transistor.

In addition to tests carried out during manufacturing, regular monitoring of DUT during operation is also necessary for optimum working. Generally, electrical or electronic or semiconductor devices may suffer degradation due to continued use. Moreover, defects may arise due to unwanted events such as voltage fluctuations or such.

To ensure proper functioning of the DUT, complex parameters such as mixer noise, phase noise, conversion gain needs to be monitored. As an example, the operating point of a transistor can be simply measured by direct current (DC) parameters such as biasing currents, reference currents, or reference voltages (depending on the actual circuit). Similarly, radar MMICs (Monolithic Microwave Integrated Circuits) need testing of complex low frequency (LF) or radio frequency (RF) parameters such as radio frequency receiver (RF-RX) conversion gain, radio frequency transmitter (RF-TX) phase noise at different offset frequencies, mixer noise tests, signal-to-noise ratio (SNR), etc. Such parameters can also be measured using DC parameters.

The measuring and monitoring of DC parameters require sophisticated equipment such as an Automatic Test Equipment ('ATE'). However, due to ATE limitations, monitoring and measuring of DC parameters consume a lot of test time and may cause potential yield loss.

Circuits configured to self-assess (Built-In-Self-Test, 'BIST') require additional chip area for such self-test and self-monitoring circuits.

Hence, an improved arrangement to measure and monitor DC parameters for assessing the proper operation of DUT may be desired.

SUMMARY

The following presents a simplified summary in order to provide a basic understanding of one or more aspects of the concepts of embodiments. This summary is not an extensive overview of the general inventive concept, and is neither intended to identify key or critical elements of the general inventive concept, nor to delineate the scope thereof. Rather, the primary purpose of the summary is to present some concepts of embodiments in a simplified form as a prelude to the more detailed description that is presented later.

Described herein are techniques that can be useful, for example, in electrical circuits that include a discrete element. Embodiments disclosed herein encompass a device, method, and apparatus.

According to one or more embodiments, there is disclosed a method for use with a circuit having a predetermined voltage-current characteristics. The method includes detecting a voltage-current relation of the circuit. The method further includes comparing the detected voltage-current relation of the circuit with the predetermined voltage-current characteristics of the circuit.

According to one or more embodiments, the method of detecting the voltage-current relation of the circuit includes setting an input parameter value at a first node in the circuit and measuring an output parameter value at a second node in the circuit.

According to one or more embodiments, there is disclosed a circuit device comprising a circuit having a predetermined voltage-current characteristics. The circuit device comprises a detector that is configured to detect a voltage-relation of the circuit. The circuit device is configured to indicate if the detected voltage-current relation of the circuit differs from the predetermined voltage-current characteristics of the circuit.

The independent claims define the concepts of embodiments in various aspects. The dependent claims state selected elements of embodiments.

This summary is submitted with the understanding that it will not be used to interpret or limit the scope or meaning of the claims. This summary is not intended to identify key features or essential features of the claimed subject matter, nor is it intended to be used as an aid in determining the scope of the claimed subject matter. Other methods, apparatus and systems are also disclosed. Those skilled in the art will recognise additional features and advantages upon reading the following detailed description, and upon viewing the accompanying drawings.

BRIEF DESCRIPTION OF THE DRAWINGS

Embodiments according to the claimed subject matter are described below with reference to the drawings. The detailed description references the accompanying figures. The same numbers can be used throughout the drawings to reference like features and components. As used herein, like terms refer to like elements throughout the description. It should be noted that views of exemplary embodiments are merely to illustrate selected features of the embodiment. The views qualitatively illustrate exemplary features of some embodiments and, therefore, should not be interpreted as being drawn to scale.

DETAILED DESCRIPTION

For purposes of explanation, numerous specific details are set forth in order to provide a thorough understanding of the claimed subject matter. It may be evident, however, that the claimed subject matter may be practiced without these specific details. Also, in some instances, well-known features are omitted or simplified to clarify the description of the exemplary implementations. In some other instances, well-known features or units or circuits have been shown in block diagram form in order avoid clutter due to unnecessary detailing.

Reference will now be made to the drawings to describe the present embodiments in detail. The implementations herein are described in terms of exemplary embodiments. However, it should be appreciated that individual aspects of the implementations may be separately claimed and one or more of the features of the various embodiments may be combined.

Figure 1:
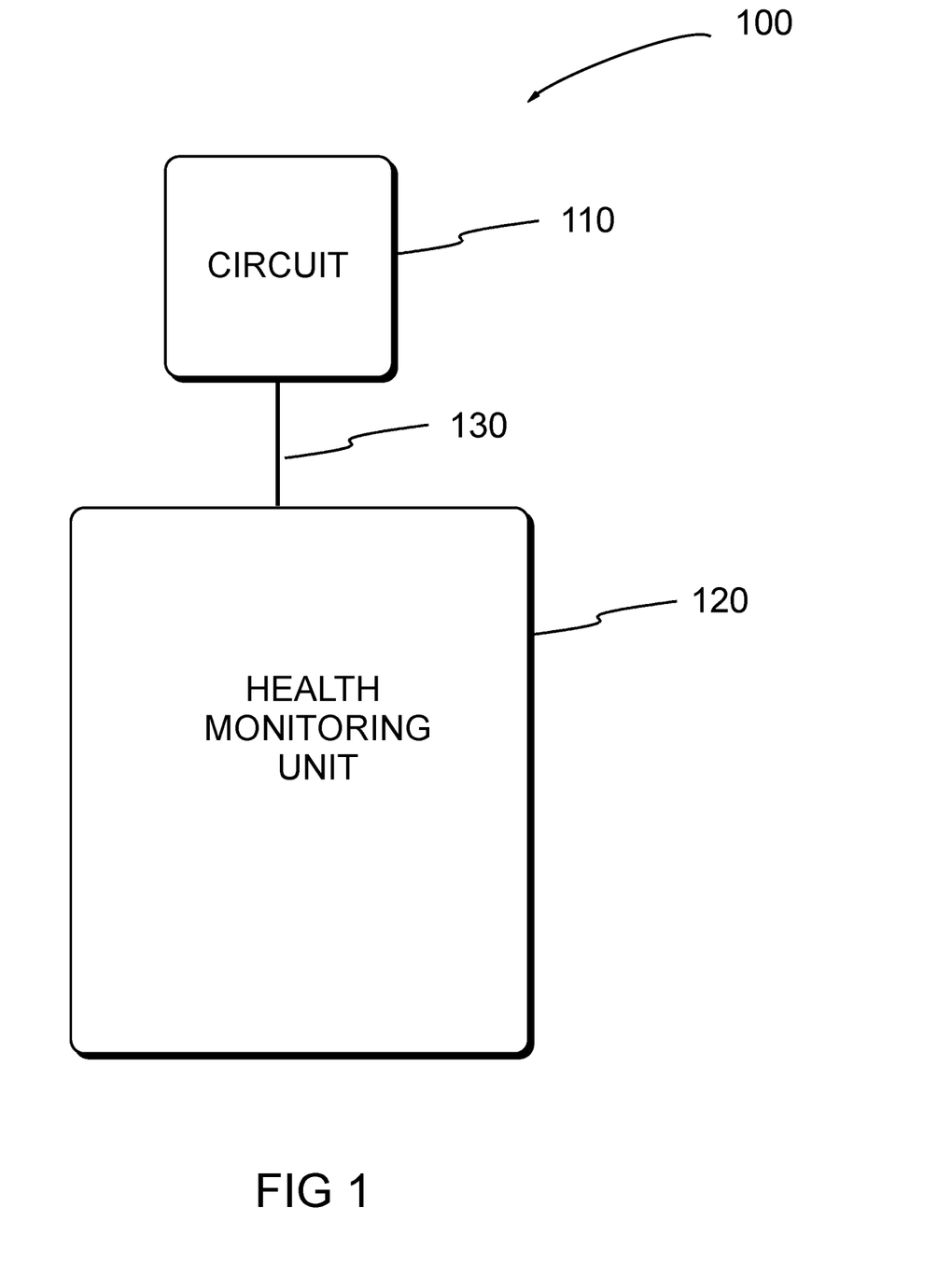
FIG. 1 is a block diagram schematically illustrating a health monitoring system according to one or more embodiments.

FIG. 1 is a block diagram schematically illustrating a health monitoring system according to some embodiments. The health monitoring system 100 as illustrated in FIG. 1 shows a circuit 110 electrically or operably coupled to a health monitoring unit 120 via at least one coupler 130. The circuit 110 may be a simple elemental circuit such a diode circuit or a transistor circuit. Or the circuit 110 may be more complex circuit such as a rectifier circuit, IQ modulator circuit, power amplifier circuit, signal mixer circuit, buffer circuit etc. In some embodiments, the circuit 110 may be a microwave integrated circuit or a monolithic microwave integrated circuit (MMIC).

The at least one coupler 130 may be configured to electrically, electronically or operably couple the health monitoring unit 120 with the circuit 110. The at least one coupler 130 may be a conductor liner contact, or a wireless contact, or an inductive contact, or an optical contact or any other suitable type. In some embodiments, the at least one coupler 130 may be removably attached to the health monitoring unit 120. It may be noted, however, that the coupler 130 may be configured to perform functions other than listed above, including but not limited to, coupling the health monitoring unit 120 to a charging unit, a battery, a storage device, a second health monitoring system, a display etc. (not shown). The coupler 130 may also be configured to couple the health monitoring unit 120 to an external server over internet, Bluetooth, Wi-Fi or any other wired or wireless medium.

The circuit 110 has a predetermined voltage-current characteristic. The predetermined voltage-current characteristic of the circuit 110 may be indicative of the circuit 110 operating as faultless or in 'healthy', 'ideal', or 'OK' mode. In some embodiments, the predetermined voltage-current characteristic may be determined by simulating operation of a model of the circuit 110. For example, computerised or software based circuit simulation tools can be used to simulate operation of the model of the circuit 110. In some other embodiments, the predetermined voltage-current characteristic may be determined by operating a prototype of the circuit 110.

Figure 2:
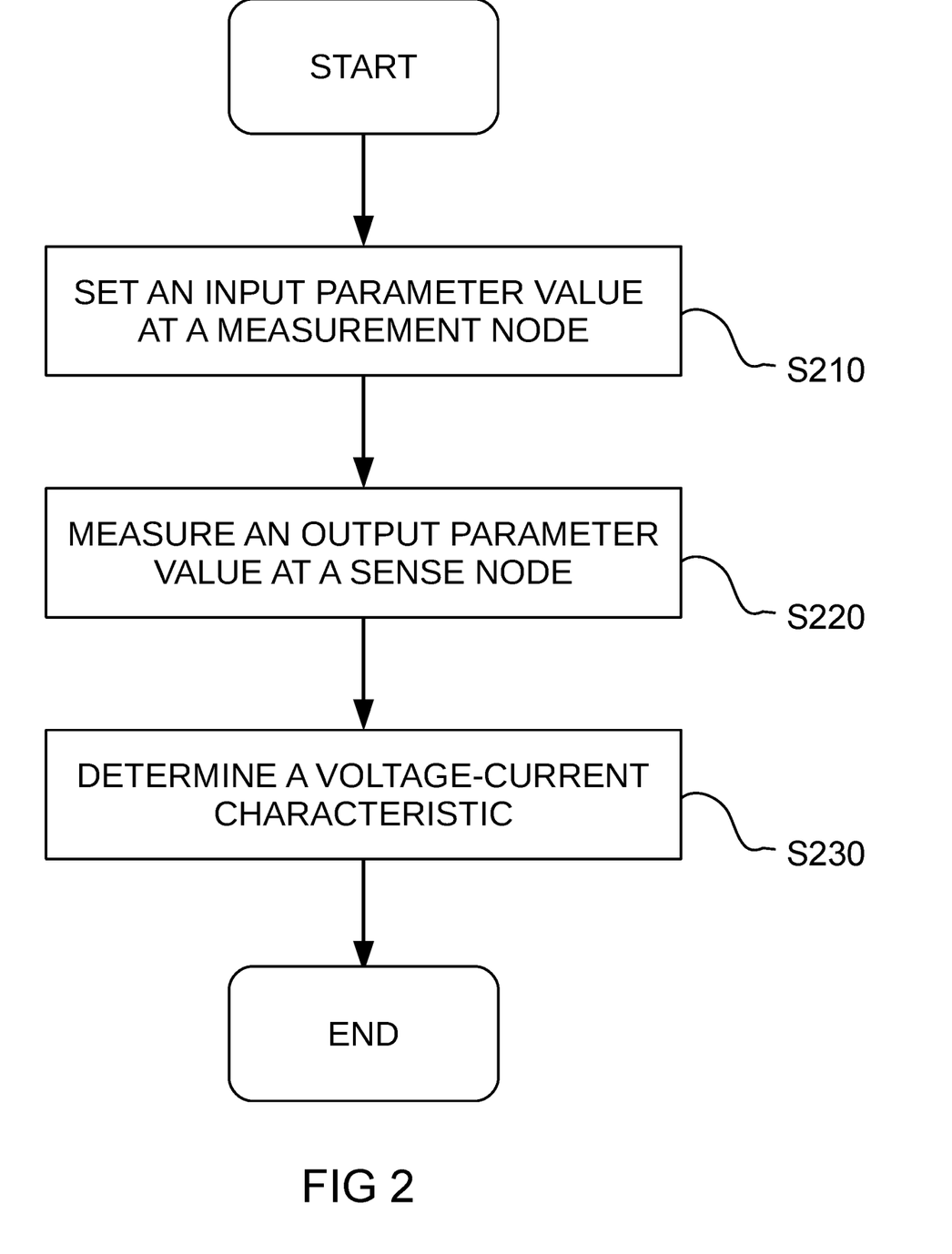
FIG. 2 is a flow chart which illustrates a method for determining a predetermined voltage-current characteristic of a circuit according to one or more embodiments.

FIG. 2 is a flow chart which illustrates a method for determining a predetermined voltage-current characteristic of a circuit according to some embodiments. A circuit or a model or a prototype of a circuit that is predefined as a reference (hereinafter referred to as 'reference circuit') is used. In some embodiments, the reference circuit is known or pre-checked to be faultless, healthy or ideal.

As shown in FIG. 2, in step S210, an input parameter value is set at a measurement node of the reference circuit. In step S220, an output parameter value is measured at a sense node of the reference circuit. In step S230, the input parameter value and the output parameter value is utilised as a data-point in determining a predetermined voltage-current characteristic. In some embodiments, the above-mentioned steps may be repeated to form additional data-points in determining the predetermined voltage-current characteristic, examples of which are shown plotted and will be described in more detail below with reference to FIG. 3A.

In an another embodiment, as shown in FIG. 2, step S210 includes setting a first input parameter value at a first measurement node and a second input parameter value at a second measurement node of the reference circuit. In step S220, an output parameter value is measured at a sense node of the reference circuit. In step S230, the first input parameter value, the second input parameter value and the output parameter value is utilised as a data-point in determining a predetermined voltage-current characteristic. In some embodiments, the above-mentioned steps may be repeated to form additional data-points in determining the predetermined voltage-current characteristic, examples of which are shown plotted and will be described in more detail below with reference to FIG. 3B.

Figure 3A:
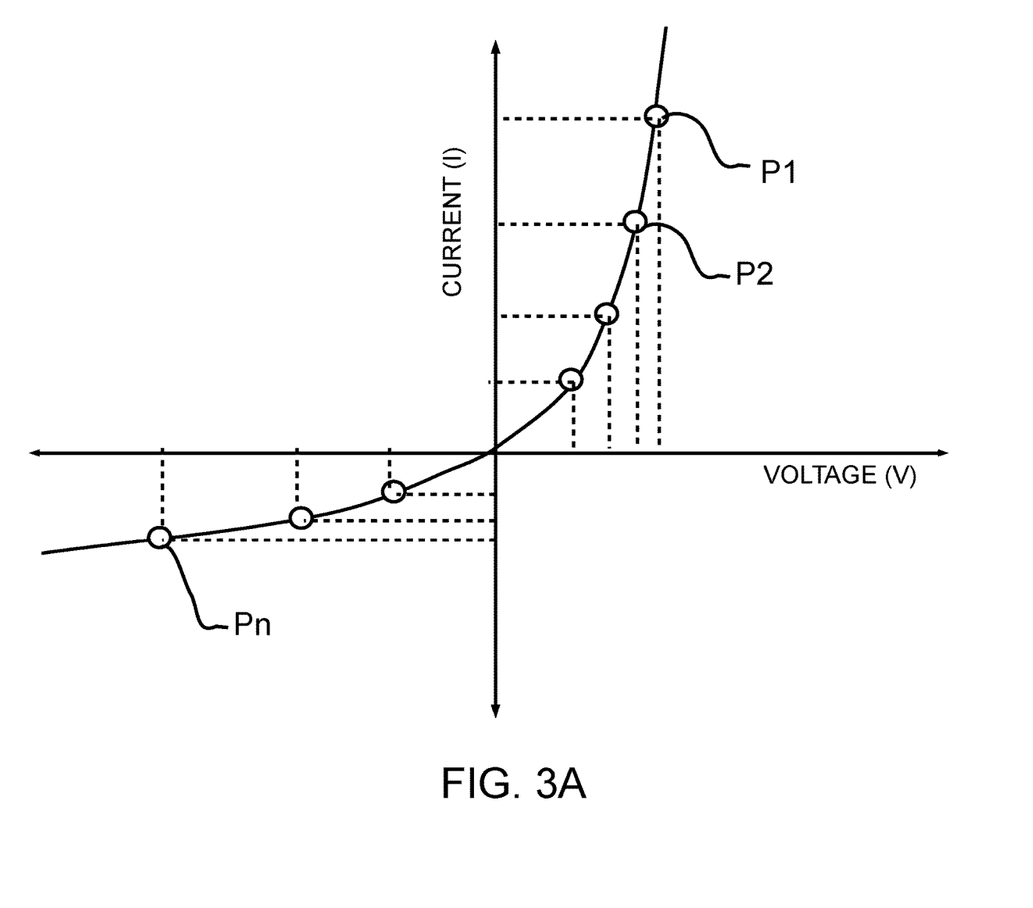
FIG. 3A is a diagram that illustrates a first example of a voltage-current characteristic.

FIG. 3A is a diagram that illustrates a first example of a voltage-current characteristic. FIG. 3A shows current values sensed at a sense node of a reference circuit plotted against voltage values set at a measurement node of the reference circuit. Selected data-points on the curve, for example, P1, P2, . . . , Pn, can be represented by a pair of co-ordinate values.

Figure 3B:
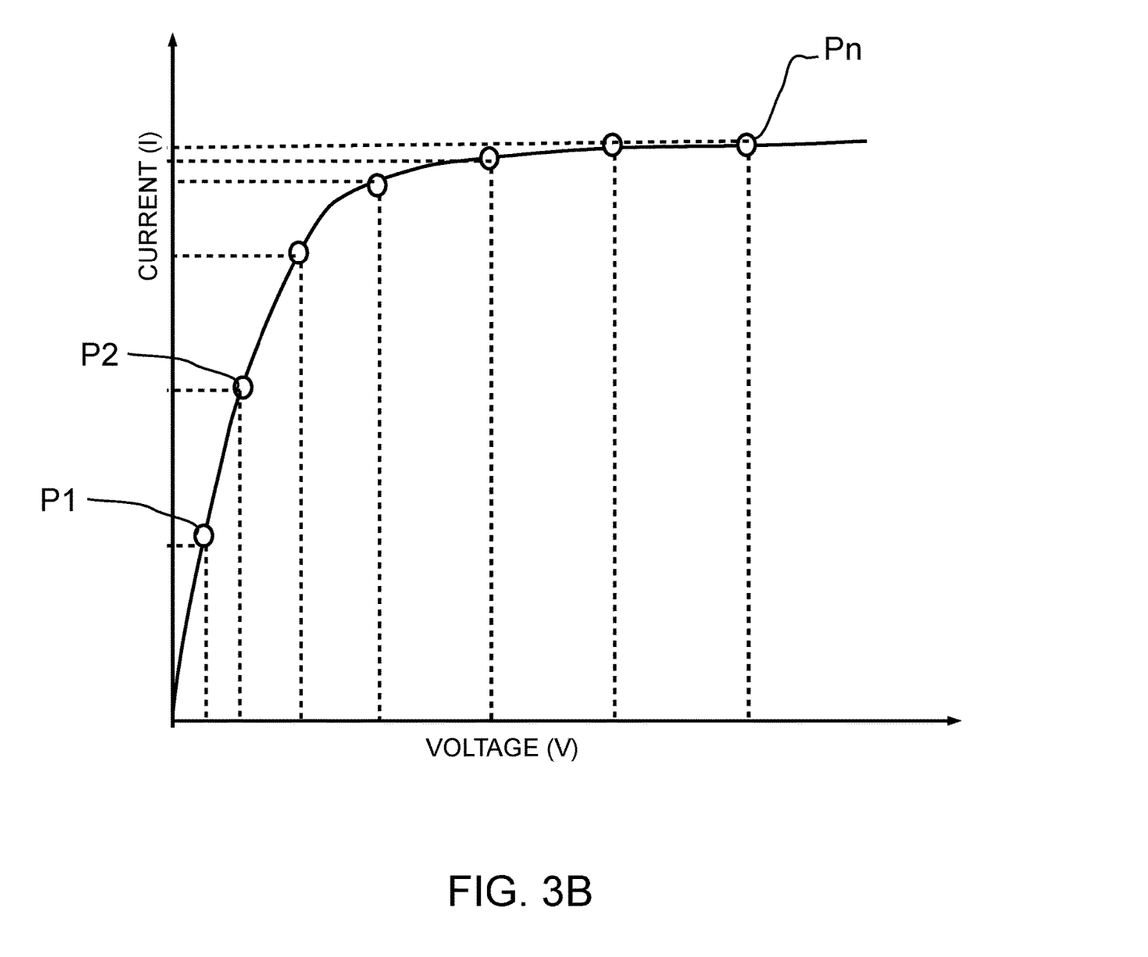
FIG. 3B is a diagram that illustrates a second example of a voltage-current characteristic.

FIG. 3B is a diagram that illustrates a second example of a voltage-current characteristic. FIG. 3B shows current values sensed at a sense node of a reference circuit plotted against voltage values set between a first measurement node and a second measurement node of the reference circuit. Selected data-points on the curve, for example, P1, P2, . . . , Pn, can be represented by a pair of co-ordinate values. For better illustration of FIG. 3B, a reference circuit may be, for example, an NPN transistor circuit. A first measurement node may be a collector terminal of the NPN transistor circuit. A first input parameter value may be a first voltage value at the collector terminal of the NPN transistor circuit. A second measurement node may be an emitter terminal of the NPN transistor circuit. A second input parameter value may be a second voltage value at the emitter terminal of the NPN transistor circuit. A sense node may be the emitter terminal of the NPN transistor circuit. Shown in FIG. 3B is a plot of the current values sensed at the emitter terminal (plotted on Y-axis) against the difference between the first voltage values at the collector terminal and the second voltage values at the emitter terminal (plotted on X-axis).

It may be noted that, as is evident from the above disclosure, the embodiments may not be limited to a health monitoring system with the circuit having only one measurement node and only one sense node. In fact, any number of measurement nodes with corresponding input parameter values may be present without deviating from the scope of the embodiments. Similarly, any number of sense nodes with corresponding output parameter values may be present without deviating from the scope of the embodiments.

Figure 4:
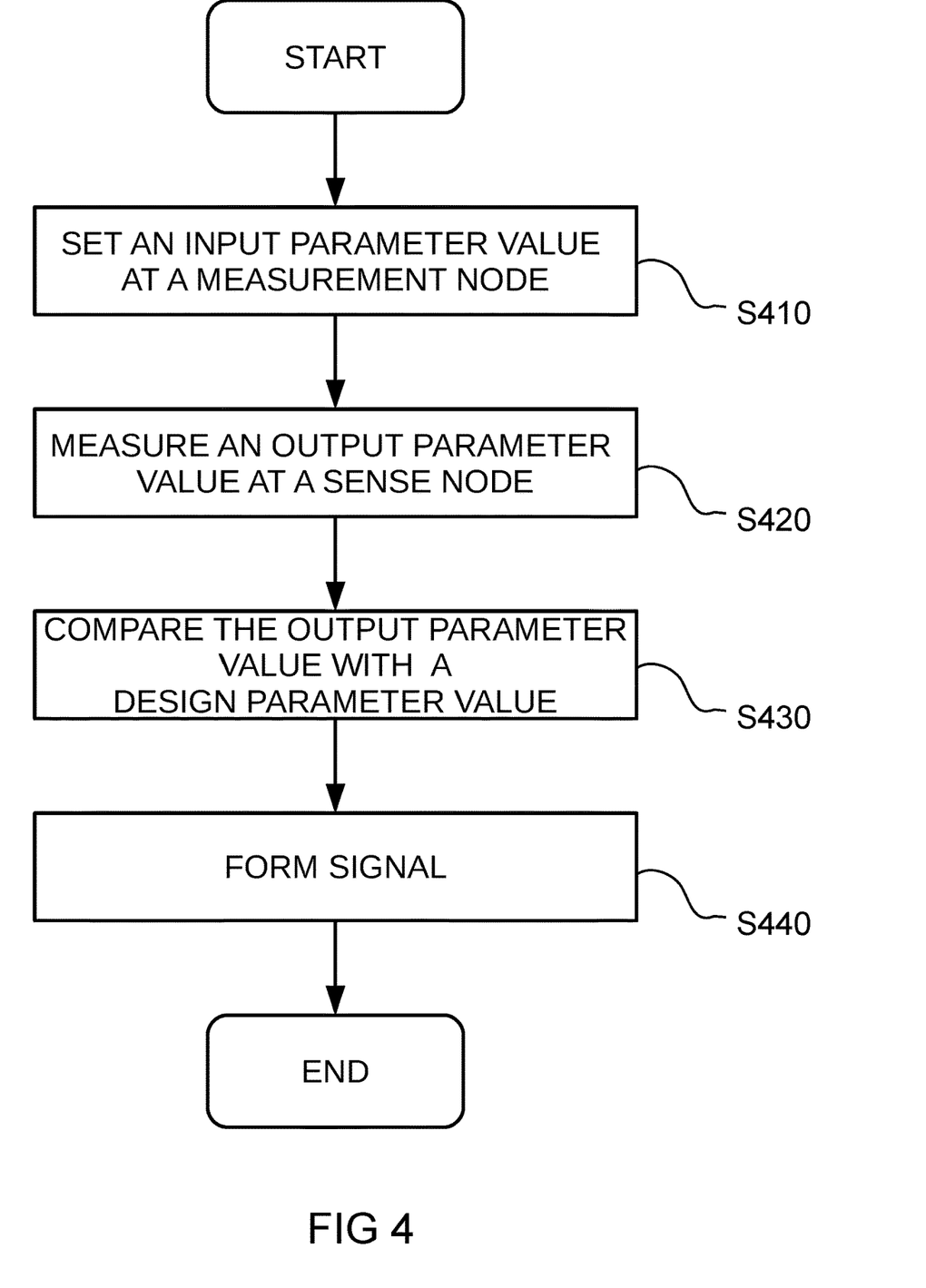
FIG. 4 is a flow chart which illustrates a method for monitoring the health of a circuit according to one or more embodiments.

FIG. 4 is a flow chart which illustrates a method for monitoring the health of a circuit according to some embodiments. According to an embodiment, the method includes detecting a voltage-current relation of a circuit and comparing the detected voltage-current relation with a predetermined voltage-current characteristic of the circuit. As shown in FIG. 3, in step S410, at-least one measurement node of the circuit is set with an input parameter value. Next, in step S420, an output parameter value is measured at at-least one sense node of the circuit. In step S430, the measured output parameter value is compared with a design parameter value, where the design parameter value is based on the predetermined voltage-current characteristics of the circuit. In response to the comparing in step S430, a signal indicative of deviation between the measured output parameter value and the design parameter value is formed in step S440.

In some embodiments, the input parameter value in step S410 is a measurement voltage value. The output parameter value measured in step S420 is a measured current value. The design parameter value in step S430 is a design current value, where the design current value corresponds to the predetermined voltage-current characteristics of the circuit. The deviation in step S504 corresponds to the difference between the measured current value in step S420 and the design current value in step S430.

In some embodiments, the input parameter value in step S410 is a measurement current value. The output parameter value measured in step S420 is a measured voltage value. The design parameter value in step S430 is a design voltage value, where the design voltage value corresponds to the predetermined voltage-current characteristics of the circuit. The deviation in step S504 corresponds to a difference between the measured voltage value in step S420 and the design voltage value in step S430.

Figure 5:
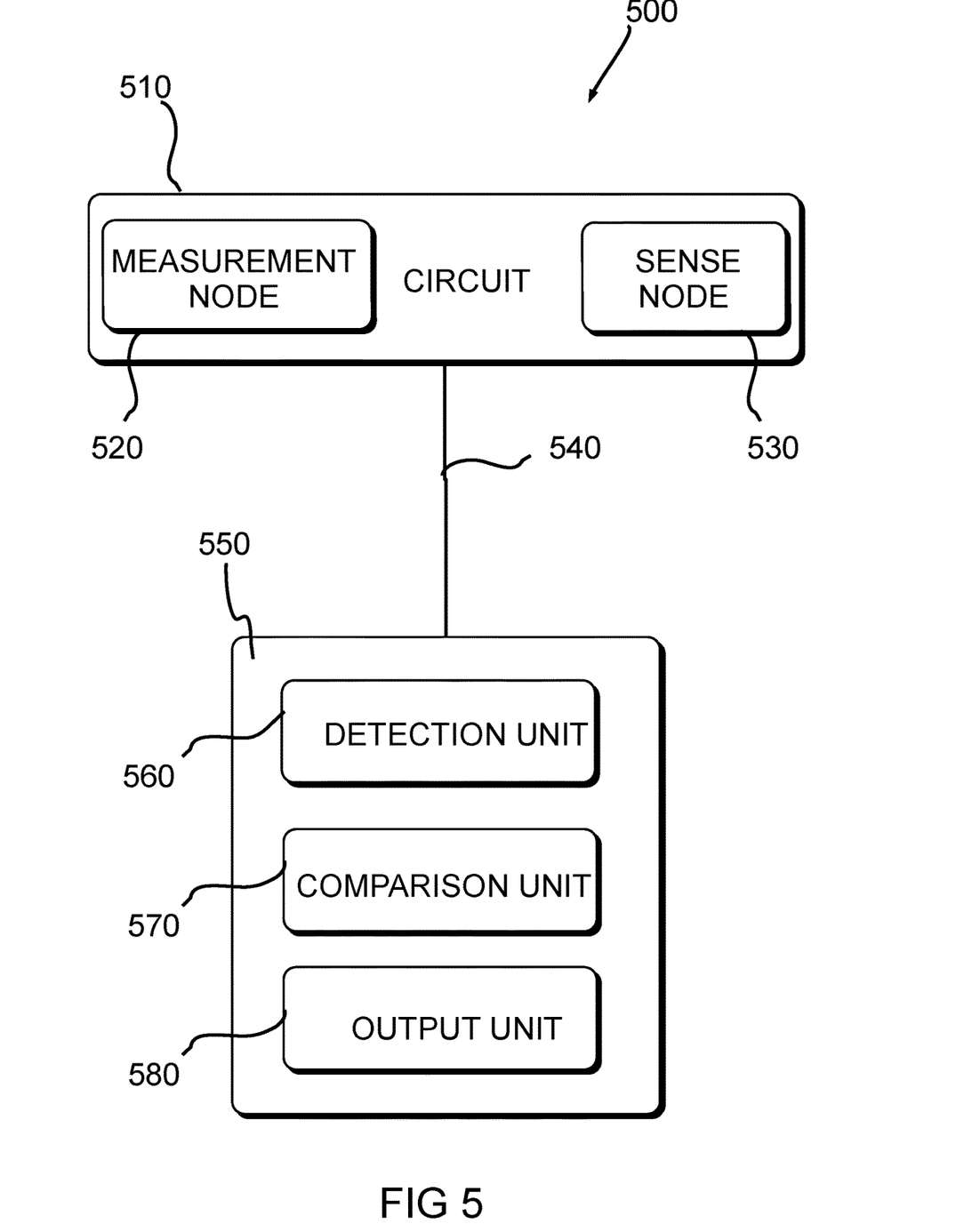
FIG. 5 is a block diagram schematically illustrating a health monitoring system according to one or more embodiments.

FIG. 5 is a block diagram schematically illustrating a health monitoring system according to some embodiments. The health monitoring system 500 includes a circuit 510 electrically or operably coupled to a health monitoring unit 550 via at least one coupler 540. The circuit 510 may include at least one measurement node 520 and at least one sense node 530. The health monitoring unit 550 may include a detection unit 560, a comparison unit 570 and an output unit 580. The detection unit 580 is configured to detect a detected voltage-current relation of the circuit 510. The comparison unit 560 is configured to compare the detected voltage-current relation detected by the detection unit 560 with the predetermined voltage-current characteristic of the circuit 510. The health monitoring unit 550 is further configured to assess the health of the circuit 510 based on the said comparing. In an embodiment, the health monitoring unit 550 may compute a deviation between the detected voltage-current relation and the predetermined voltage-current characteristics. In some embodiments, the output unit 580 may be configured to form a signal indicative of the computed deviation. The output unit 580 may further be configured to provide an alarm if the deviation exceeds a threshold value. The alarm may be in the form of visual, audio, haptic or any other suitable form.

Although shown here separately, it may be noted that, in some embodiments, the detection unit 560, the comparison unit 570 and the output unit 580 may be a single integrated unit performing functions of each.

In some embodiments, the health monitoring unit 550 is configured to perform some or all of the following acts: The health monitoring unit 550 sets the measurement node 520 of the circuit 510 to a measurement voltage value (input parameter value). Corresponding to the measurement voltage value (input parameter value), the health monitoring unit 550 measures a measured current value (output parameter value) at the sense node 530 of the circuit 510. Further, based on the predetermined voltage-current characteristics of the circuit 510, the health monitoring unit 550 computes a design current value corresponding to the measurement voltage value (input parameter value). The health monitoring unit 550 is further configured to compare the measured current value (output parameter value) with the design current value. The health monitoring unit 550 can also be configured to perform other acts not described herein.

In some embodiments, the health monitoring unit 550 is configured to perform some or all of the following acts: The health monitoring unit 550 sets the measurement node 520 of the circuit 510 to a measurement current value (input parameter value). Corresponding to the measurement current value (input parameter value), the health monitoring unit 550 measures a measured voltage value (output parameter value) at the sense node 530 of the circuit 510. Further, based on the predetermined voltage-current characteristics of the circuit 510, the health monitoring unit 550 computes a design voltage value corresponding to the measurement current value (input parameter value). The health monitoring unit 550 is further configured to compare the measured voltage value (output parameter value) with the design voltage value. The health monitoring unit 550 can also be configured to perform other acts not described herein.

In some embodiments, the health monitoring unit 550 may form a part of the circuit 510 or be permanently coupled to the circuit 510. At least one effect can be that the circuit 510 can perform a test during operation. In particular, the circuit 510 can be configured to perform a self-test or to conduct self-monitoring, in particular, while or intermittently with performing another functional operation in accordance with a design purpose of the circuit 520. At least one effect can be that modifications or changes of the characteristics of circuit elements, for example, due to ageing, such as leakage currents can be detected and/or monitored.

Figure 6:
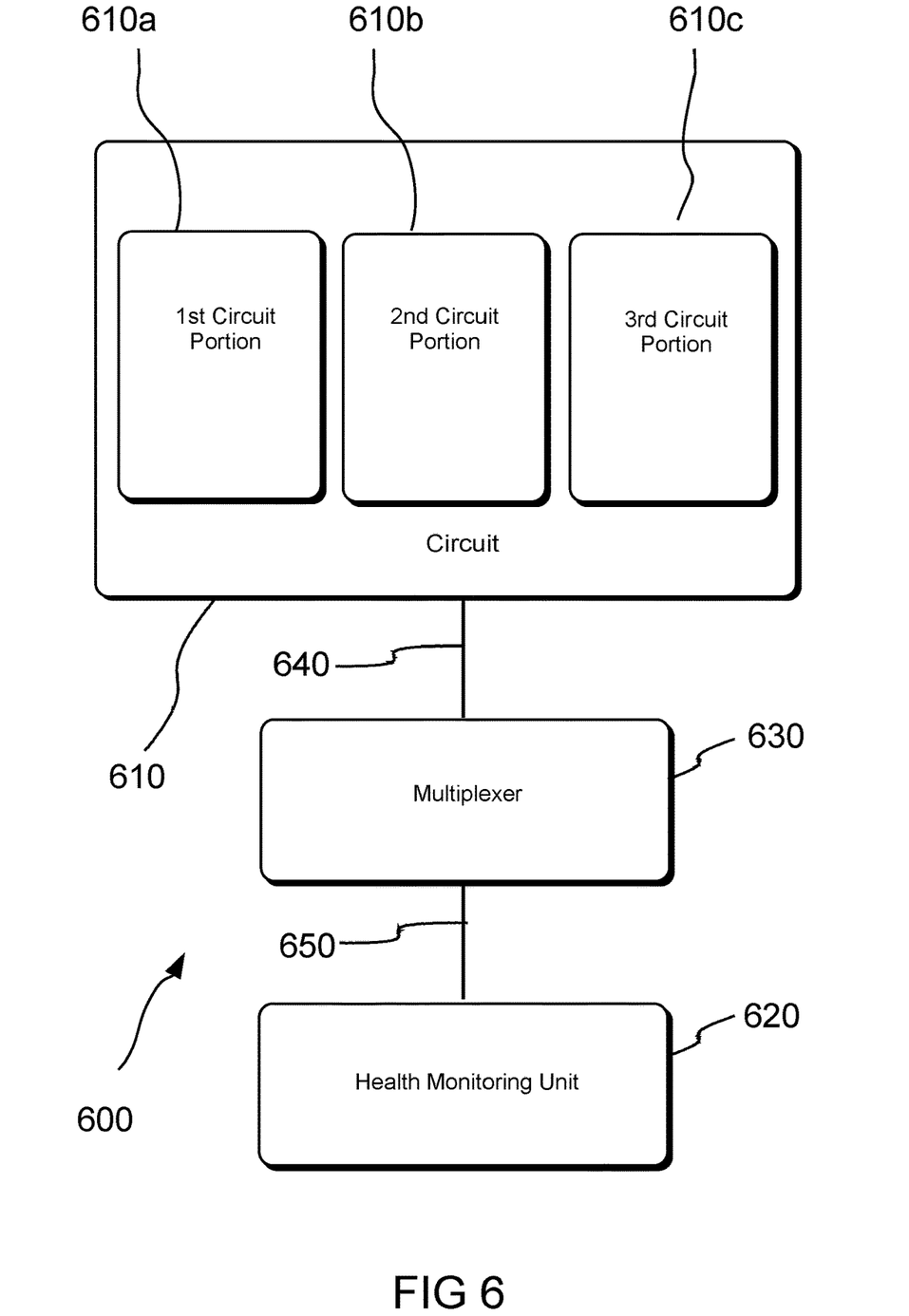
FIG. 6 is a block diagram schematically illustrating a health monitoring system according to one or more embodiments.

FIG. 6 is a block diagram schematically illustrating a health monitoring system according to some embodiments. The health monitoring system 600 includes a circuit 610, a health monitoring unit 620 and a multiplexer 630.

The circuit 610 includes a plurality of circuit portions 610a, 610b, 610c having a plurality of predetermined partial voltage-current characteristics. The plurality of predetermined partial voltage-current characteristics of the plurality of circuit portions 610a, 610b, 610c may be consolidated in the predetermined voltage-current characteristics of the circuit 610.

The multiplexer 630 may be electrically, electronically or operably coupled to the circuit 610 via an at least one first coupler 640. The multiplexer 630 may be electrically, electronically or operably coupled to the health monitoring unit 620 via an at least one second coupler 650. The multiplexer 630 may be configured to select at least one signal from a plurality of signals of the plurality of circuit portions 610a, 610b, 610c for the health monitoring unit 620. In some embodiments, the multiplexer 630 is provided as an analog multiplexer. The analog multiplexer may be configured to selectively transmit at least one analog signal from a plurality of analog signals of the plurality of circuit portions 610a, 610b, 610c to the health monitoring unit 620. In some embodiments (not shown in FIG. 6), the multiplexer may form a part of the health monitoring unit 620. In some other embodiments, the multiplexer may for a part of the circuit 610.

Based on the at least one signal selected by the multiplexer and outputted to the health monitoring unit 620, the health monitoring unit 620 may be configured to detect the partial voltage-current relation of at least one of the plurality of circuit portions 610a, 610b, 610c. The health monitoring unit 620 may further be configured to compare the detected partial voltage-current relation with the predetermined partial voltage-current characteristic of at least one of the plurality of circuit portions 610a, 610b, 610c. In some embodiments, the health monitoring unit 620 may configured to detect the voltage-current relation of the circuit 610 based on the at least one signal selected by the multiplexer and outputted to the health monitoring unit 620. The health monitoring unit 620 may further be configured to compare the detected voltage-current relation with the predetermined voltage-current characteristic of the circuit 610.

The at least one first coupler 640 may be a conductor liner contact, or a wireless contact, or an inductive contact, or an optical contact or any other suitable type. In some embodiments, the at least one first coupler 640 may be removably attached to the circuit 610. The at least one second coupler 650 may be a conductor liner contact, or a wireless contact, or an inductive contact, or an optical contact or any other suitable type. In some embodiments, the at least one second coupler 650 may be removably attached to the health monitoring unit 620.

In some embodiments, the health monitoring system, described in FIGS. 1 to 6, may additionally include or be coupled to a memory unit (not shown in FIGS. 1 to 6). The memory unit may be configured to store the predetermined voltage-current characteristic of the circuit. The memory unit may further be configured to store the predetermined partial voltage-current characteristic of at least one of the plurality of circuit portions of the circuit. In some embodiments, the memory unit may also be configured to store the voltage-current relation of the circuit, detected by the health monitoring unit. The memory unit may further be configured to store the partial voltage-current relation of at least one of the plurality of circuit portions of the circuit, detected by the health monitoring unit. It may be noted, however, that the memory unit may also be configured to store data other than that mentioned above, such as circuit profile data, a user credential data and so on.

In some embodiments, the health monitoring system, described in FIGS. 1 to 6, may additionally include or be coupled to an adaptive unit (not shown in FIGS. 1 to 6). The adaptive unit may be configured to adapt or learn the predetermined voltage-current characteristics over time. The adaptive unit may further be configured to adapt or learn the detected voltage-current relation over time. For example, computerised or software based statistical and data analysis tools can be used to determine a relationship of the detected voltage-current relation with time. The adaptive unit may also be configured to forecast a future health of the circuit. For example, computerised or software based forecasting or prediction modelling tools employing techniques such as data mining, machine learning, artificial intelligence, pattern matching etc. can be used to forecast a future health of the circuit. In some embodiments, the memory unit and the adaptive unit may be a single integrated unit performing functions of each.

In some embodiments, the health monitoring system, described in FIG. 1 to 6, may be configured to cause automatic monitoring of the circuit at predetermined time intervals. In some other embodiments, the health monitoring system may be configured to cause automatic monitoring of the circuit at predetermined instances. Examples of predetermined instances include instance of booting-up the circuit, instance of shutting-down the circuit, instance of heating of the circuit beyond a threshold temperature and so on.

In still other embodiments, the health monitoring system may be configured to cause monitoring of the circuit when requested by an external agent, such as a user of the circuit.

Figure 7:
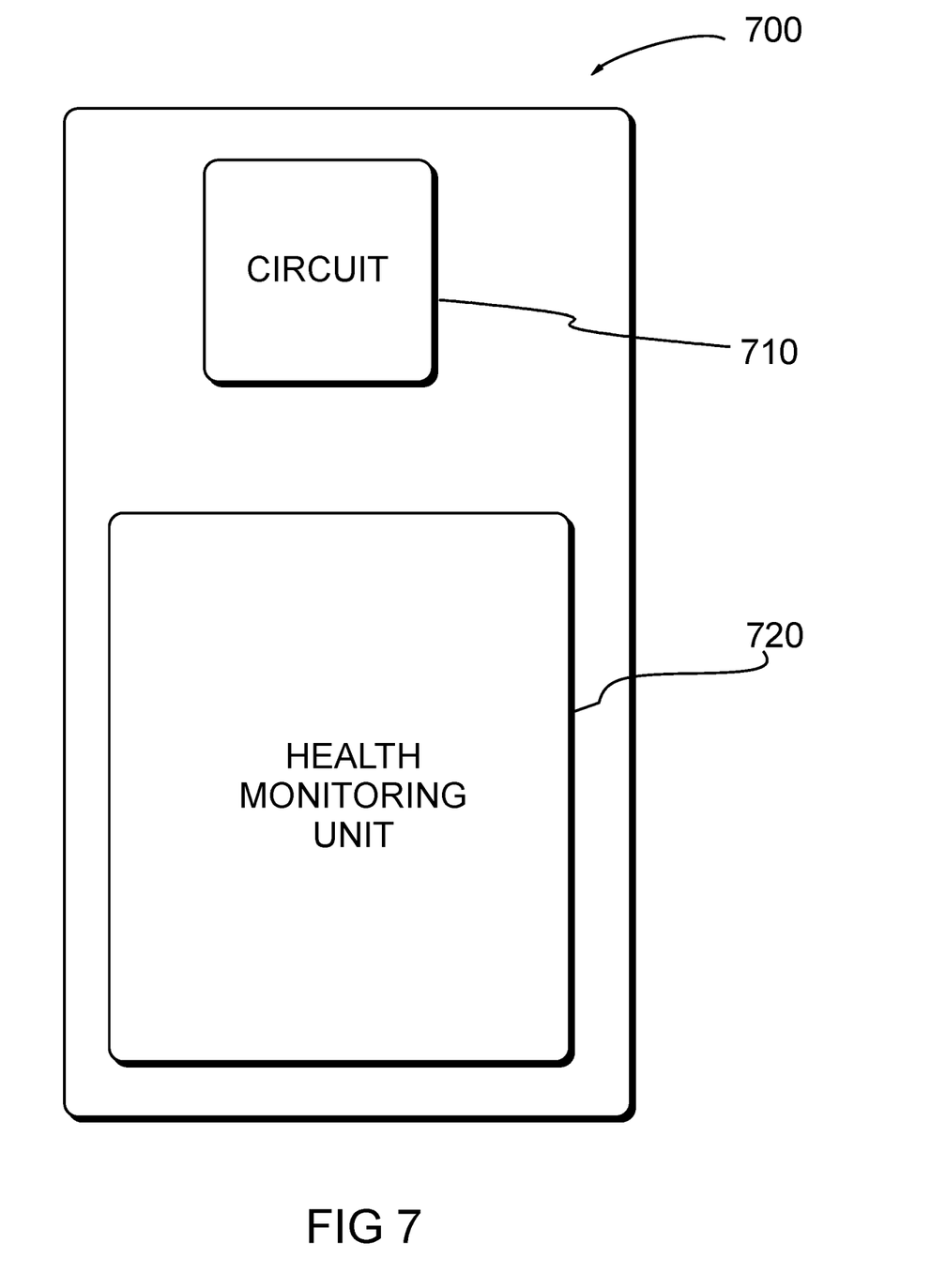
FIG. 7 is a block diagram schematically showing a circuit device according to one or more embodiments.

FIG. 7 is a block diagram schematically showing a circuit device according to some embodiments. The circuit device 700 includes a circuit 710 and a health monitoring unit 720. The circuit device 700 may be a simple elemental circuit device such a diode or a transistor. Or the circuit device 700 may be more complex circuit device such as a rectifier, a group of transistors, a modulator, for example an IQ modulator, an amplifier, for example a power amplifier and/or an operational amplifier, a signal mixer, a buffer, an analog-to-digital converter, a digital-to-analog converter, a filter, for example an active filter and/or a passive filter, a brown-out detector, a power supply, for example, a switched power supply, a phase locked loop, a current source, a current mirror, a comparator, a schmitt trigger, etc. In some embodiments, the circuit device 700 may be a microwave integrated circuit device or a monolithic microwave integrated circuit (MMIC) device. In some embodiments, the health monitoring unit 720 may form a part of the circuit 710 or be permanently coupled to the circuit 710. At least one effect can be that the circuit device 700 can perform a test during operation. In particular, the circuit device 700 can be configured to perform a self-test or to conduct self-monitoring.

Figure 8:
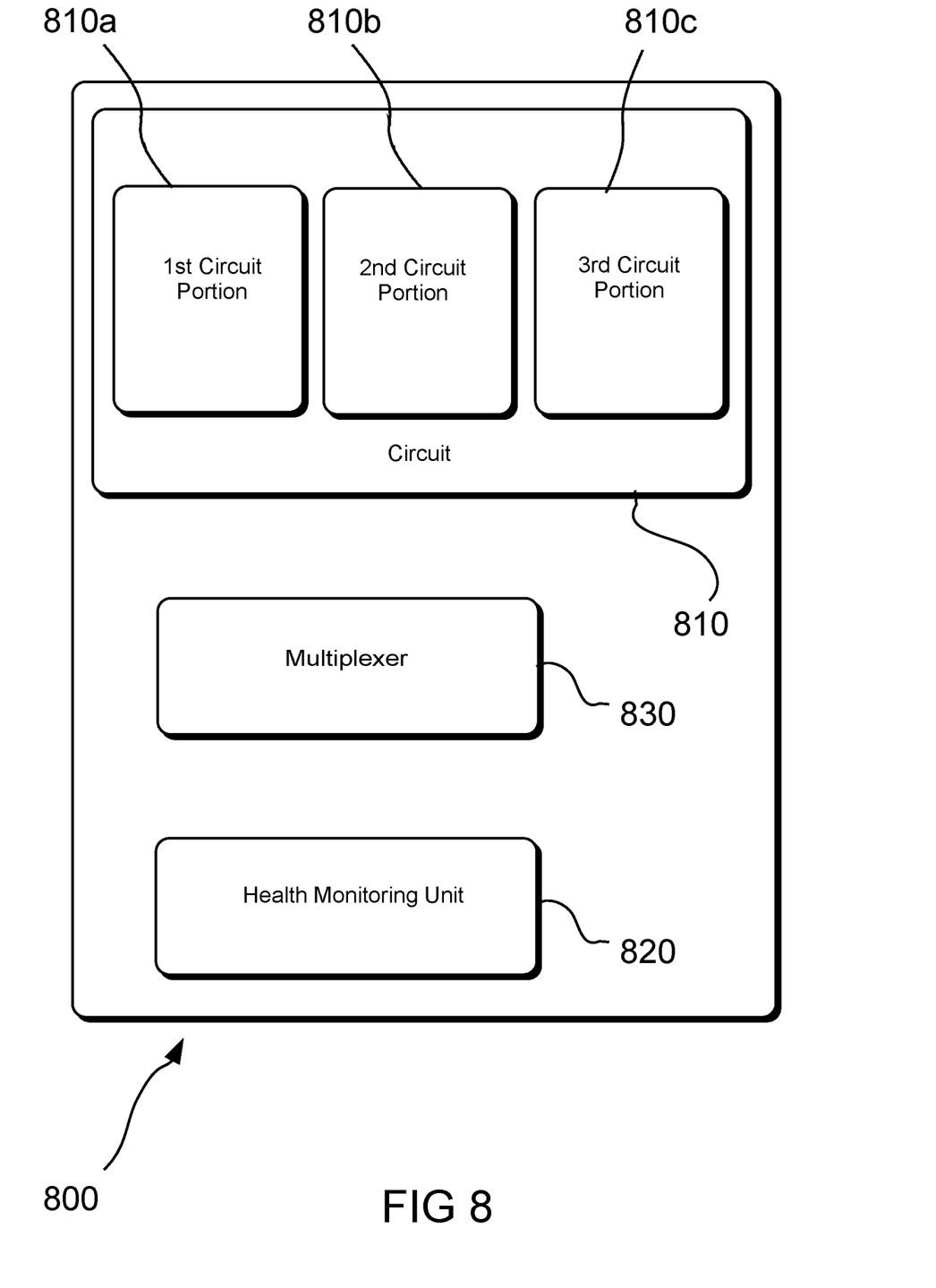
FIG. 8 is a block diagram schematically showing a circuit device according to one or more embodiments.

FIG. 8 is a block diagram schematically showing a circuit device according to some embodiments. The circuit device 800 includes a circuit 810, a health monitoring unit 820 and a multiplexer 830. The circuit 810 may include a plurality of circuit portions 810a, 810b, 810c. The multiplexer 830 may be configured to select at least one signal from a plurality of signals of the plurality of circuit portions 810a, 810b, 810c for the health monitoring unit 820.

Embodiments described herein thus relate to a method, device and apparatus for use in verifying, testing and/or monitoring the health of an electrical or electronic or semiconductor circuit device by determining the current-voltage characteristics of the circuit device. In some embodiments, the circuit of the device under test is an integrated circuit.

The techniques disclosed herein, in some embodiments, can be used in verifying the circuit device. In particular, in some embodiments, the techniques can be used in verifying the integrated circuit. In some embodiments, the verifying is conducted in a laboratory setting.

The techniques disclosed herein, in some embodiments, are used in testing the circuit device. In particular, in some embodiments, the techniques can be used in testing the integrated circuit. In some embodiments, testing is conducted in a factory setting. At least one effect can be that the techniques make feasible testing of circuit devices as a part of a manufacturing process or subsequent to a manufacturing process so as to detect a functional anomaly, for example, due to a variation in the manufacturing process, and classify the circuit device accordingly.

The techniques disclosed herein, in some embodiments, are used in monitoring the circuit device. In particular, in some embodiments, the techniques can be used in monitoring the integrated circuit. In some embodiments, monitoring is conducted during operation of the circuit device. At least one effect can be that the techniques make feasible monitoring of circuit device in operation of the circuit device so as to detect an atypical function, a malfunction or other modification in functionality, for example, due to latent malfunction ab initio and/or due to aging of the circuit device. For example, in some embodiments, a leakage current that develops over time due to aging of the circuit device can be detected.

As used herein, terms such as 'first', 'second', and the like, are also used to describe various elements, regions, sections, etc. and are also not intended to be limiting.

As used herein, the terms 'coupled' and 'connected' may have been used to describe how various elements interface. Unless expressly stated or at least implied otherwise, such described interfacing of various elements may be either direct or indirect.

As used herein, the articles 'a' and 'an' should generally be construed to mean 'one or more,' unless specified otherwise or clear from context to be directed to a singular form.

As used herein, the word 'exemplary', 'for example' or the like, means serving as an example, instance, or illustration. Any aspect or design described herein as 'exemplary', 'for example' or the like is not necessarily to be construed as preferred or advantageous over other aspects or designs. Rather, use of the word 'exemplary', 'for example' or the like is intended to present concepts and techniques in a concrete fashion.

As used herein, the terms 'determine', 'calculate' and 'compute', and variations thereof, are used interchangeably and include any type of methodology, process, mathematical operation or technique.

As used herein, the term 'unit' can refer to any known or later developed hardware, software, firmware, or combination thereof that is capable of performing the functionality associated with that element.

In the above description of exemplary implementations, for purposes of explanation, specific numbers, element arrangement, unit configurations, and other details are set forth in order to better explain the embodiments, as claimed. However, it will be apparent to one skilled in the art that the claimed embodiments may be practiced using different details than the exemplary ones described herein. For example, in some embodiments, the multiplexer may be integrated in the circuit device while the health monitoring unit may be external to the circuit device.

The inventors intend the described exemplary embodiments/implementations to be primarily examples. The inventors do not intend these exemplary embodiments/implementations to limit the scope of the appended claims. Rather, the inventors have contemplated that the claimed embodiments might also be embodied and implemented in other ways, in conjunction with other present or future technologies. Although the disclosure has been shown and described with respect to one or more implementations, equivalent alterations and modifications will occur to others skilled in the art based upon a reading and understanding of this specification and the annexed drawings.

What is claimed is:

1. A method for use with a circuit device, wherein the circuit device comprises a circuit having an adaptive voltage-current characteristic, and a detector configured to detect a voltage-current relation of the circuit, the method comprising:
   adapting, by the detector, the adaptive voltage-current characteristic over time;
   detecting, by the detector, the voltage-current relation of the circuit;
   comparing, by the detector, the detected voltage-current relation with the adaptive voltage-current characteristic to generate a comparison result; and
   based on the comparison result, generating a signal by the detector, the signal indicating that the detected voltage-current relation differs from the adaptive voltage-current characteristic;
   wherein detecting the voltage-current relation of the circuit comprises:
      applying, by the detector, a predefined voltage at a measurement node of the circuit;
      sensing, by the detector, a measured current through a measurement portion of the circuit, wherein the measured current is produced at the measurement portion of the circuit in response to the predefined voltage applied to the measurement node; and
      determining, by the detector, a corresponding design current expected at the measurement portion of the circuit in response to the predefined voltage by cross-referencing the predefined voltage to the adaptive voltage-current characteristic in order to determine the corresponding design current, and
   wherein comparing the detected voltage-current relation with the adaptive voltage-current characteristic to generate the comparison result comprises:
      comparing, by the detector, the measured current to the corresponding design current to generate the comparison result.

2. The method of claim 1, the method comprising:
   identifying, by the detector, the adaptive voltage-current characteristic based on simulating operation of a model of the circuit.

3. The method of claim 1, the method comprising:
   identifying, by the detector, the adaptive voltage-current characteristic based on operating a prototype of the circuit.

4. The method of claim 1, the method comprising:
   identifying, by the detector, a plurality of circuit portions of the circuit;
   identifying, by the detector, a plurality of adaptive partial voltage-current characteristics, each of the plurality of adaptive partial voltage-current characteristics corresponding to a different one of the plurality of circuit portions of the circuit; and
   consolidating, by the detector, the plurality of adaptive partial voltage-current characteristics in the adaptive voltage-current characteristic.

5. The method of claim 1, the method further comprising:
   generating, by the detector, a signal indicative of a difference of the measured current to the corresponding design current exceeding a threshold current difference or not.

6. The method of claim 1, further comprising:
   forecasting, by the detector, a future health of the circuit using at least one of data mining, machine learning, artificial intelligence, and pattern matching.

7. A method for use with a circuit device, wherein the circuit device comprises a circuit having an adaptive voltage-current characteristic, and a detector configured to detect a voltage-current relation of the circuit, the method comprising:
   adapting, by the detector, the adaptive voltage-current characteristic over time;
   detecting, by the detector, the voltage-current relation of the circuit;
   comparing, by the detector, the detected voltage-current relation with the adaptive voltage-current characteristic to generate a comparison result; and
   based on the comparison result, generating a signal by the detector, the signal indicating that the detected voltage-current relation differs from the adaptive voltage-current characteristic;
   wherein detecting the voltage-current relation of the circuit comprises:

applying, by the detector, a predefined current to a measurement node of the circuit;

at a sense node of the circuit, sensing, by the detector, a measured voltage across the circuit, wherein the measured voltage is produced at the sense node in response to the predefined current applied to the measurement node; and determining, by the detector, a corresponding design voltage expected at the sense node in response to the predefined current by cross-referencing the predefined current to the adaptive voltage-current characteristic in order to determine the corresponding design voltage, and wherein comparing the detected voltage-current relation with the adaptive voltage-current characteristic to generate the comparison result comprises:

comparing, by the detector, the measured voltage to the corresponding design voltage to generate the comparison result.

8. The method of claim 7, further comprising:

generating, by the detector, a signal indicative of a difference of the measured voltage to the corresponding design voltage exceeding a threshold voltage difference or not.

9. A circuit device, comprising:

a circuit having an adaptive voltage-current characteristic; and a detector configured to adapt the adaptive voltage-current characteristic over time, measure a voltage-current relation of the circuit, compare the measured voltage-current relation with the adaptive voltage-current characteristic to generate a comparison result, and generate a signal indicating that the detected voltage-current relation differs from the adaptive voltage-current characteristic;

wherein the detector is further configured to:

apply a predefined voltage at a measurement node of the circuit;

sense a measured current through a measurement portion of the circuit, wherein the measured current is produced at the measurement portion of the circuit in response to the predefined voltage applied to the measurement node;

determine a corresponding design current expected at the measurement portion of the circuit in response to the predefined voltage by cross-referencing the predefined voltage to the adaptive voltage-current characteristic in order to determine the corresponding design current; and compare the measured current to the corresponding design current to generate the comparison result.

10. The circuit device of claim 9, wherein the adaptive voltage-current characteristic is based on a simulated operation of a model of the circuit.

11. The circuit device of claim 9, wherein the adaptive voltage-current characteristic is based on an operation of a prototype of the circuit.

12. The circuit device of claim 9, wherein the circuit comprises a plurality of circuit portions having a plurality of adaptive partial voltage-current characteristics, and the circuit device further comprises:

a multiplexer coupled to the plurality of circuit portions and configured to select at least one selected signal from a plurality of signals of the plurality of circuit portions for the detector to measure the voltage-current relation of the circuit.

13. The circuit device of claim 9, wherein the circuit device is configured to perform a built-in self-test on the circuit via the detector.

14. The circuit device of claim 13, wherein the detector is configured to set a measurement node of the circuit to a measurement voltage and to sense a measured current through a measurement portion of the circuit.

15. The circuit device of claim 14, wherein:

the detector is configured to generate a signal indicative of a difference of the measured current to the corresponding design current exceeding a threshold current or not.

16. The circuit device of claim 13, wherein the detector is configured to provide a measurement current to a measurement node of the circuit and to sense, at a sense node, a measured voltage across the circuit.

17. The circuit device of claim 9, wherein the circuit comprises at least one of a group consisting of a modulator, a power amplifier, a buffer, a signal mixer, an analog-to-digital converter, a digital-to-analog converter, an active filter, a passive filter, a brown-out detector, a power supply, a switched power supply, an analog phase locked loop, a current source, a current mirror, a comparator, an operational amplifier, a schmitt trigger.

18. The circuit device of claim 9, wherein the circuit device is provided as a microwave integrated circuit.

19. A circuit device, comprising:

a circuit having an adaptive voltage-current characteristic; and a detector configured to adapt the adaptive voltage-current characteristic over time, measure a voltage-current relation of the circuit, compare the measured voltage-current relation with the adaptive voltage-current characteristic to generate a comparison result, and generate a signal indicating that the detected voltage-current relation differs from the adaptive voltage-current characteristic;

wherein the detector is further configured to:

apply a predefined current to a measurement node of the circuit;

at a sense node of the circuit, sense a measured voltage across the circuit, wherein the measured voltage is produced at the sense node in response to the predefined current applied to the measurement node;

determine a corresponding design voltage expected at the sense node in response to the predefined current by cross-referencing the predefined current to the adaptive voltage-current characteristic in order to determine the corresponding design voltage; and compare the measured voltage to the corresponding design voltage to generate the comparison result, and the detector is configured to generate a signal indicative of a difference of the measured voltage to the corresponding design voltage exceeding a threshold voltage or not.

20. A circuit monitoring device, comprising:

at least one coupler configured to electrically couple to a circuit;

an input parameter circuit configured to cause a predefined current to flow through the circuit;

a sense circuit configured to sense a measured voltage across the circuit, wherein the measured voltage is produced in response to the predefined current flowing through the circuit; and at least one processing circuit configured to:

adapt the adaptive voltage-current characteristic over time, determine a corresponding design voltage expected across the circuit in response to the predefined current by cross-referencing the predefined current to an adaptive voltage-current characteristic of the circuit, and compare the measured voltage to the corresponding design voltage to generate a signal indicating a difference between the measured voltage and the corresponding design voltage.

21. A circuit monitoring device, comprising:

at least one coupler configured to electrically couple to a circuit;

an input parameter circuit configured to set a predefined voltage across the circuit;

a sense circuit configured to sense a measured current flowing through the circuit, wherein the measured current is produced in response to the predefined voltage set across the circuit; and at least one processing circuit configured to:
  adapt the adaptive voltage-current characteristic over time,
  determine a corresponding design current expected to flow through the circuit in response to the predefined voltage by cross-referencing the predefined voltage to an adaptive voltage-current characteristic, and
  compare the measured current to the corresponding design current to generate a signal indicating a difference between the measured current and the corresponding design current.

* * * * *